United States Patent [19]

Morita et al.

[11] Patent Number: 5,308,799
[45] Date of Patent: May 3, 1994

[54] OXIDE SUPERCONDUCTOR AND PROCESS FOR PREPARATION THEREOF

[75] Inventors: Mitsuru Morita; Keiichi Kimura; Katsuyoshi Miyamoto; Kiyoshi Sawano; Seiki Takebayashi; Masamoto Tanaka, all of Kawasaki, Japan

[73] Assignee: Nippon Steel Corporation, Tokyo, Japan

[21] Appl. No.: 834,554
[22] PCT Filed: Jun. 7, 1991
[86] PCT No.: PCT/JP91/00769
§ 371 Date: Feb. 6, 1992
§ 102(e) Date: Feb. 6, 1992
[87] PCT Pub. No.: WO91/19029
PCT Pub. Date: Dec. 12, 1991

[30] Foreign Application Priority Data

Jun. 7, 1990 [JP] Japan .................. 2-147406
Nov. 6, 1990 [JP] Japan .................. 2-299025
Dec. 14, 1990 [JP] Japan .................. 2-402204
Feb. 12, 1991 [JP] Japan .................. 3-38911

[51] Int. Cl.$^5$ .............. C01F 11/02; C01F 17/00; C01G 3/02; H01L 39/12
[52] U.S. Cl. .............. 505/126; 252/521; 427/62; 505/778; 505/779; 505/780; 505/785; 505/452; 505/570
[58] Field of Search .............. 427/62, 63; 505/785, 505/1, 777, 778, 779, 780

[56] References Cited

U.S. PATENT DOCUMENTS

| | | | |
|---|---|---|---|
| 4,826,808 | 5/1989 | Yurek | 505/1 |
| 4,857,504 | 8/1989 | Hermann | 505/1 |
| 4,990,493 | 2/1991 | Lay | 505/1 |
| 5,084,436 | 1/1992 | Morimoto | 505/1 |
| 5,087,605 | 2/1992 | Hegde | 505/1 |

FOREIGN PATENT DOCUMENTS 2-48459 2/1990 Japan.

OTHER PUBLICATIONS

Physica C 162–164 (1989), pp. 1217–1218 (No month available).
Preprints of the 50th Symposium of the Japan Society of Applied Physics, Autumn, 1989, 29a-P-10 (No month available).
Sawano et al., J. Ceramic Society of Japan, International Edition, vol. 97, No. 10, Oct. 1989, Tokyo, Japan, pp. 1014–1018.
Hirota et al., Patent Abstracts of Japan, vol. 13, No. 290, (C–614)(3638), Jul. 5, 1989, and (JP-A-1 083 589), (Matsushita Electric Indco Ltd), Mar. 29, 1989 *abstract*.

*Primary Examiner*—Paul Lieberman
*Assistant Examiner*—John Boyd
*Attorney, Agent, or Firm*—Wenderoth, Lind & Ponack

[57] ABSTRACT

The present invention relates to an oxide superconductor comprising a composite oxide of RE, Ba and Cu, wherein the superconductor comprises a micro structure comprised of a monocrystalline $REBa_2Cu_3O_{7-x}$ phase (123 phase) and a $RE_2BaCuO_5$ phase (211 phase) finely dispersed therein, the 123 phase being formed in a plurality of domains respectively for individual RE compositions and in the order of the 123 phase forming temperatures in respective layers. The present invention relates also to a process for the preparation of an oxide superconductor, characterized by forming a layer from a mixed powder of the RE, Ba and Cu compounds, forming another layer(s) of a mixed powder of RE, Ba and Cu compounds having another RE composition(s) different from the above-mentioned RE composition in the 123 phase forming temperature to form a multi layer structure, putting said plurality of layers on top of one another so that the 123 phase forming temperatures in respective layers continue towards a higher temperature side or a lower temperature side, subjecting the assembly to press molding to form a precursor, putting said precursor on a supporting material with the layer having the highest 123 phase forming temperature being located at the highest position, heating said precursor to a temperature range in a solid liquid coexisting region to bring said precursor into a semi molten state, and either gradually cooling said precursor in a 123 phase temperature range or inoculating the precursor with a seed crystal and gradually cooling the inoculated precursor in the above mentioned temperature range to grow a 123 phase crystal at a growth rate of 5 mm/hr or less.

16 Claims, 6 Drawing Sheets

Sm—BASED SEED CRYSTAL

Y—BASED SUPERCONDUCTOR 1 mm 1 mm

Sm-BASED BARRIER (POLYCRYSTAL)

1 mm

OXIDE SUPERCONDUCTOR AND PROCESS FOR PREPARATION THEREOF

TECHNICAL FIELD

The present invention relates to an oxide superconductor and a process for the preparation thereof.

BACKGROUND ART

A $YBa_2Cu_3O_{7-x}$ type (123 phase type) superconductor prepared by a QMG (quench and melt growth) method, that is, a kind of a melt method, apparently has a critical current density (Jc) of $10^4$ A/cm$^2$ or more under conditions of 77K and 1T which suffices for practical use (see "New Superconducting Materials Forum News", No. 10 (1988), p. 15). Studies have been made also on an increase in the size of the QMG material and a combination of RE elements (see "Physica C", 162-164 (1989), pp. 1217-1218 or Preprints of the 50th Symposium of the Japan Society of Applied Physics, Autumn, 1989, 29a-P-10). In these methods, an oxide superconductor material containing Y element alone or various RE elements is unidirectionally grown in a temperature gradient to increase the size of a crystal.

In a polycrystalline structure, a grain boundary acts as a weak link to decrease superconducting properties. The above-mentioned study on the increase in the size of the crystal has been made for the purpose of solving this problem.

The above-mentioned prior art technique, however, can provide only a single crystal material having a size of 0.3 cm$^3$ at the largest, and it was very difficult to unidirectionally grow the 123 phase structure to form a large single crystal.

That is, the prior art could not solve problems regarding the means for forming a nucleus of a crystal, a method of regulating the growth of a crystal, etc.

An object of the present invention is to provide a material comprising a $REBa_2Cu_3O_{7-x}$ phase in a large-size single crystal form (hereinafter referred to as "123 phase") in an oxide superconductor comprising a composite oxide of at least two elements selected from the group consisting of Y, Sm, Eu, Gd, Dy, Ho, Er, Tm, Yb and Lu (hereinafter referred to as "RE elements"), Ba and Cu.

Another object of the present invention is to provide a material having a structure such that a $RE_2BaCuO_5$ phase (hereinafter referred to as "211 phase") having a very small grain diameter is dispersed in a large size 123 phase.

CONSTITUTION OF THE INVENTION

In order to attain the above-mentioned objects, the present invention provides a technique for controlling the growth of a crystal by varying the kinds of the RE elements or the kinds of the RE elements and the mixing ratio of the RE elements (hereinafter referred to as "composition of RE") through the utilization of the difference in the crystal forming temperature inherent in individual components of RE, and a process for the preparation of a large size crystal through inoculation of a seed crystal.

Specifically, the present invention-provides a superconductor comprising a composite oxide of a RE element(s), Ba and Cu, wherein said superconductor is an oxide high temperature superconductor having a micro structure comprising a monocrystalline 123 phase and a 211 phase finely dispersed therein; said 123 phase being formed in a plurality of domains respectively for individual RE compositions and in the order of the 123 phase forming temperatures in respective domains. The invention also provides a process for the preparation of the oxide high temperature superconductor, characterized by mixing oxides (including composite oxides) of RE, Ba and Cu so that the molar ratio of metal elements (RE, Ba, Cu) falls within a region defined by connecting points (10, 60, 30), (10, 20, 70) and (50, 20, 30) to each other, forming another mixed powder having a RE composition different from said mixed powder in the temperature of formation of the 123 phase of the RE composition in said mixed powder so as to have a composition falling within said region, putting said plurality of mixed powders in the order of the 123 phase forming temperature in the RE composition to form a multilayer structure, subjecting the assembly to press molding to form a precursor, heating said precursor to a temperature region wherein a solid phase (211 phase) determined by the RE composition and a liquid phase determined by an oxide of Ba and Cu coexist (a solid-liquid coexisting region) to thereby bring the precursor into a semi molten state, and cooling the precursor in a 123 phase forming temperature region determined by the RE composition under predetermined conditions in a gradual or stage holding manner, or cooling the precursor from the solid liquid coexisting region to a seed crystal inoculation temperature, inoculating a seed crystal (a single crystal of a 123 phase according to RE composition having a 123 phase forming temperature above the maximum 123 phase forming temperature in the RE composition of the precursor) into the precursor at said temperature and cooling said inoculated precursor under the same conditions as those described above in a gradual or stage holding manner. The above-mentioned process enables an oxide superconductor having the abovementioned features to be produced through the control of the nucleation of the 123 phase to increase the size of a grown crystal.

BEST MODE OF CARRYING OUT THE INVENTION

The best mode of carrying out the present invention will now be described in detail.

The 123 phase forming temperature, Tg, in an oxide superconductor is determined by the composition of rare earth elements (including Y) contained in the oxide superconductor. In the air, the 123 crystal forming temperature of RE elements used in the present invention among the rare earth elements is approximately as given in Table 1.

TABLE 1

| RE | Y | Sm | Eu | Gd | Dy | Ho | Er | Tm | Yb | Lu |
|---|---|---|---|---|---|---|---|---|---|---|
| °C. | 1000 | 1060 | 1050 | 1030 | 1010 | 990 | 980 | 960 | 900 | 880 |

The smaller the atomic number, that is, the larger the radius of the RE element, the higher the crystal forming temperature.

When a plurality of RE elements are mixed with each other, the formation temperature, Tg, of a crystal having a composition wherein the molar fraction of $RE_1$, the molar fraction of $RE_2$, ...... in the whole RE element are $m_1$, $m_2$, ......, respectively $RE_1(m_1)$, $RE_2(m_2)$, .....], can be approximately expressed by the following equation.

$$Tg = (Tg(RE_1) \times m1 + Tg(RE_2) \times m2 + ....)$$

Among the rare earth elements, each of the Ce, Pr and Tb elements, as such, does not form a 123 phase structure, so that these elements are not used as the rare earth elements according to the present invention. Further, with respect to La, an initial crystal from the molten state comprises $(La_{1-x}Ba_x)_2CuO_4$, and with respect to Nd, an initial crystal from the molten state comprises $Nd_{1+y}Ba_{2-y}Cu_3O_{7-x}$. That is, they provide no genuine 123 phase intended in the present invention. For this reason, they, as such, are not used in the present invention. Since, however, the addition of La and Nd in a minor amount to other RE systems can enhance the 123 phase forming temperature, they can increase the temperature range in the selection of RE. Further, it is also possible to use them for enhancing the 123 phase forming temperature of the seed crystal.

Figure 1:
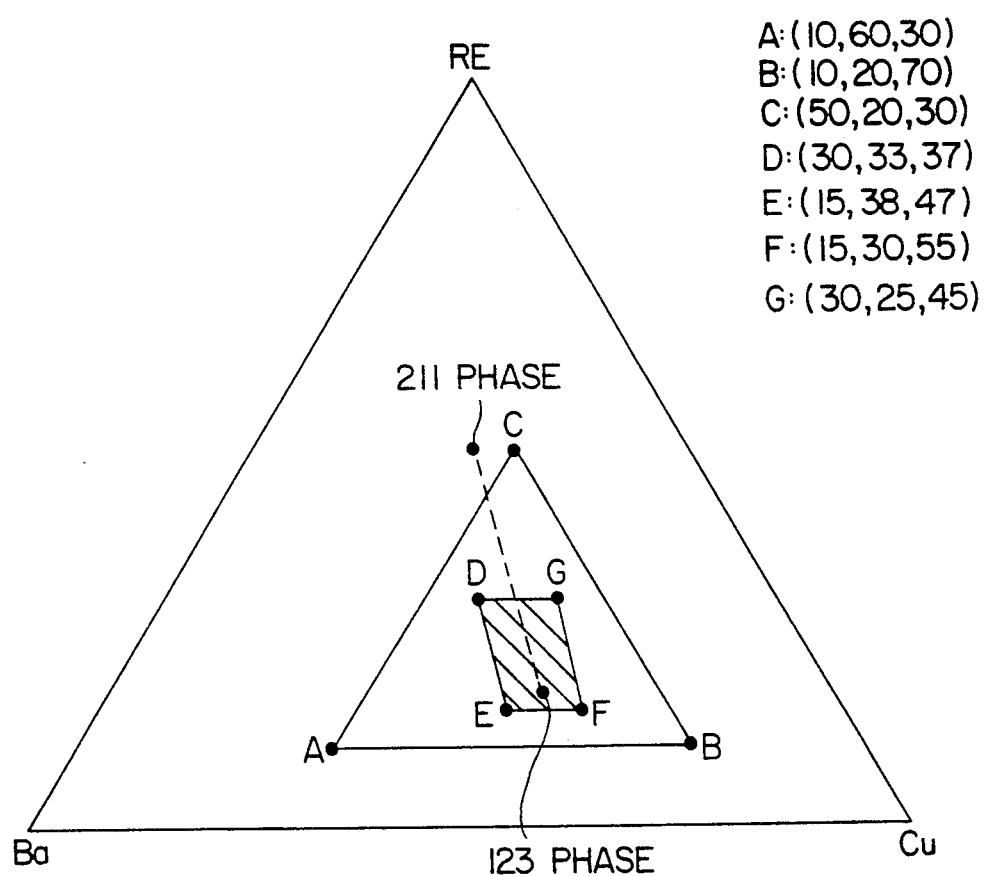
FIG. 1 is a ternary equilibrium diagram of RE, Ba and Cu.

The process for the preparation of a superconductor according to the present invention based on the above-mentioned findings will now be described. Oxides (including composite oxides) of RE, Ba and Cu are mixed with each other so that the molar ratio of metal elements (RE, Ba, Cu) falls within a region defined by connecting to each other a point A (10, 60, 30), a point B (10, 20, 70) and a point C (50, 20, 30) in a ternary equilibrium phase diagram shown in FIG. 1, and a layer is formed from the mixture. When the composition is outside the abovementioned region, the shape of a precursor, which will be described later, cannot be maintained at the time of heating of the precursor to a solid liquid coexisting region and, further, the formation of the 123 phase does not proceed smoothly during cooling steps after heating.

The molar ratio preferably falls within a region defined by connecting, to each other, a point D (30, 33, 37), a point E (15, 38, 47), a point F (15, 30, 55) and a point G (30, 25, 45) of the phase diagram.

In this case, $RE_2O_3$, $BaCuO_3$, BaO, CuO, $CuO_2$, $BaCuO_2$, $RE_2BaCuO_5$, $REBa_2Cu_3O_{7-x}$, etc. are considered as starting materials.

Then, other RE elements having a 123 phase forming temperature different from that of the RE elements in the above mentioned mixed powder, for example, RE elements having a 123 phase forming temperature above or below that of the above-mentioned powder mixture layer, are mixed with each other so as to have a composition falling within the above mentioned region, and this mixture is put in layer form on the mixed powder layer to form a double layer structure.

The above-mentioned procedure is repeated to put mixed powders comprising a plurality of RE compositions on top of one another to form a plurality of layers. In this case, the lamination is conducted so that the 123 phase forming temperatures of the RE compositions in respective layers continues towards a higher temperature side or a lower temperature side.

The layer thickness is preferably about 2 cm or less from the viewpoint of the effect attained by the present invention, the working efficiency, etc.

After individual layers are put on top of one another, the resultant assembly is pressed and molded to form a precursor.

The precursor may be prepared by a lap quenching process. The lap quenching process comprises heating the above-mentioned mixed powder layer to a temperature of 1200° C. or above to form a melt, pressing the melt against a cooled material, for example, a cooled mass made of a metal having high heat conductivity, to rapidly cool the layer (hammer quenching process), thereby forming a molding, subjecting a mixed powder layer containing other RE elements different from said molding in the 123 phase forming temperature to a molding in the same manner as that described above, thereby forming another molding, and putting a plurality of these moldings on top of one another so that the 123 phase forming temperatures of individual moldings continue towards a higher temperature side or a lower temperature side, thereby forming a precursor.

The composition of the precursor produced by the powder lamination process or the lap quenching process has such a composition that an oxide of RE is finely dispersed in oxides of Ba and Cu.

The process for the preparation of a superconductor by using the above mentioned precursor will now be described.

At the outset, the precursor is put on a support in such a manner that the layer having the highest 123 phase forming temperature is located on the highest position, and then heated within a temperature range in a solid liquid coexisting region, that is, in the range of from a temperature above the 123 phase forming temperature (Tg) to below the 211 phase dissolution temperature (Td) (that is, the lower limit of the heating temperature is a temperature capable of sufficiently decomposing a Lu based 123 phase while the upper limit of the heating temperature is a temperature at which the precursor cannot maintain its shape due to the decomposition of a Sm-based 211 phase (about 900° to 1300° C.)) for 15 to 45 min to bring the precursor into a semi molten state, thereby forming a 211 phase (a solid phase) in a liquid phase (Ba, Cu oxides).

Then, the precursor is cooled at an arbitrary cooling rate from the above-mentioned temperature range to a temperature of $(Tg(H)+10)°$ C. and subjected to gradual cooling or stage holding cooling substantially equivalent to the gradual cooling in the temperature range of from $(Tg(H)+10)°$ C. to $(Tg(L)\ 40)°$ C. to grow a 123 phase at a growth rate of 5 mm/hr or less.

Tg(H) represents the highest 123 phase forming temperature of the RE compositions in the precursor, and Tg(L) represents the lowest 123 phase forming temperature.

In the 123 phase crystal, since the structure is complicated, the entropy change in the crystallization is so large that it is difficult to bring about nucleation. This often renders the growth incomplete. For this reason, it is necessary to conduct gradual cooling or stage holding cooling in a temperature range of from 1070° C. at which the Sm based 123 phase begins to form to 840° C. at which the growth of the Lu based 123 phase is fully completed (see Table 1).

The substantially average cooling rate, R (° C./hr), in the above mentioned gradual cooling or stage holding cooling is determined by the following formula:

$$R \leq k \cdot \Delta Tg/D$$

wherein k represents a target grain growth speed (mm/hr);

$\Delta Tg$ represents a maximum Tg deviation, provided that $\Delta Tg = (Tg(H)+10)°$ C. $- (Tg(L)-40)°$ C.; and D represents a total thickness (mm).

The gradual cooling or stage holding cooling at a cooling rate represented by the above mentioned formula enables cooling to be successively conducted according to the 123 phase forming temperatures of respective layers. In particular, when use is made of the following technique wherein a seed crystal is inoculated, it is possible to produce a monocrystalline 123 phase in each layer.

The gradual cooling may be conducted in an atmosphere having a temperature gradient of 2° C. or more. Alternatively, the precursor may be moved so as to provide the above mentioned temperature gradient.

In the treatment at the 123 phase forming temperature, the formation of a nucleus is allowed to begin with a layer having the highest 123 phase forming temperature, Tg(H), in the precursor, and the crystal is grown while allowing the crystal growth direction to succeed to layers having a lower 123 phase forming temperature. The formation of a multi-layer structure in the above-mentioned manner enables the effective prevention of the occurrence of other crystal nucleuses compared with a single layer structure having the same dimension.

A technique for attaining a better effect of the present invention wherein the precursor is inoculated with a monocrystalline seed crystal containing a 123 phase and having a 123 phase forming temperature above the highest 123 phase forming temperature, Tg(H), in the precursor will now be described.

At the outset, as described above, the precursor is put on a support material and then heated to a solid liquid coexisting temperature range, thereby bringing the precursor into a semi molten state.

Then, the precursor is cooled from the above-mentioned temperature range to the seed crystal inoculation temperature, that is, to a temperature in the range of from 900° to 1100° C. In this temperature range, the precursor is inoculated with a seed crystal. The lower limit in the above-mentioned temperature range was determined based on the fact that it is possible to use as the seed crystal a Yb-based 123 phase, while the upper limit was determined based on the fact that it is possible to use as the seed crystal a Sm-based 123 phase crystal containing La and Nd.

The seed crystal comprises a RE composition having a 123 phase forming temperature higher than the 123 phase forming temperature of the RE composition in the precursor, and is a crystal wherein at least a face in contact with the precursor has a monocrystalline structure.

After the precursor is inoculated with a seed crystal, it is subjected to gradual cooling or stage holding cooling in a temperature region of from $(Tg(H)+10)°$ C. to $(Tg(L)-40)°$ C.

The inoculation of the precursor in a semi molten state having a temperature close to the 123 phase forming temperature with the above mentioned seed crystal (a single crystal or a polycrystal having a contacting face in a single crystal form) enables a crystal nucleus of a 123 phase to be formed from the seed crystal and, at the same time, the crystal direction of the 123 phase is more strictly controlled in a direction capable of providing a higher current density through the growth of a 123 phase in an arbitrary direction identical to that of the seed crystal, so that it is possible to attain a very high critical current density in combination with an increase in the size of the 123 phase crystal.

It is also possible to add at least one of Pt and Rh to the above-mentioned precursor components. This enables the grain diameter of the 211 phase in the 123 phase to be reduced. Pt and Rh may be added in respective amounts of 0.2 to 2.0% by weight and 0.005 to 1.0% by weight. This enables the effect of the present invention to be efficiently exhibited.

When the precursor is subjected to a heat treatment, it should be supported by some material. At the present time, platinum is mainly used as the supporting material. Since, however, the liquid phase component in a semi molten state (oxides of Ba and Cu) has high reactivity, the contact of the liquid component with the supporting material for a long period of time brings about deviation of the liquid phase component and contamination from an impurity element, so that the crystallinity and superconductive properties are spoiled. The present inventors have found that the 123 phase per se can serve as a stable supporting material. Specifically, between the above-mentioned precursor (hereinafter referred to as "precursor M") and the supporting material supporting the precursor M are provided another precursor H comprising a RE composition having a crystal forming temperature above that of the RE composition of the 123 phase in the precursor M and a further precursor L comprising a RE composition having a crystal forming temperature below that of the RE composition of the 123 phase in the precursor M. That is, an assembly comprising precursor M-precursor L-precursor H-supporting material disposed in that order is provided, and these precursors are utilized as a barrier to the supporting material. The precursor H is used as a barrier for preventing the liquid phase portion of the precursor M from flowing out to the supporting material, while the precursor L is used as a barrier for preventing the 123 phase crystal derived from the precursor H from growing to inhibit the crystal growth of the precursor M. If the 123 phase of the lowermost layer in the precursor M has the same function as that of the precursor L, it is possible to omit the precursor L. The provision of these barriers enables the crystal to be more efficiently grown.

The present inventors have made the following experiment on the inoculation of the precursor of the present invention with a seed crystal.

$Y(Yb)Ba_2Cu_3O_{7-x}$ powders and $Y(Yb)_2BaCuO_5$ powders with the proportion of Y to Yb being varied in 10 % increments as specified in Table 2 were prepared, and 20% by mole of the $Y(Yb)_2BaCuO_5$ powder was added to the $Y(Yb)Ba_2Cu_3O_{7-x}$ powder so that the ratio RE : Ba : Cu was 6:9:13. The mixtures were heat melted at 1400° C., and lap hammer quenching was conducted 9 times so that the Y component was successively replaced with Yb to prepare precursors. Due to the difference in the RE component, the 123 phase forming temperatures become as given in Table 2.

TABLE 2

| Y:Yb (%) | 100:0 | 90:10 | 80:20 | 70:30 | 60:40 | 50:50 | 40:60 | 30:70 | 20:80 |
|---|---|---|---|---|---|---|---|---|---|
| °C. | 1000 | 990 | 980 | 970 | 960 | 950 | 940 | 930 | 920 |

Figure 2:
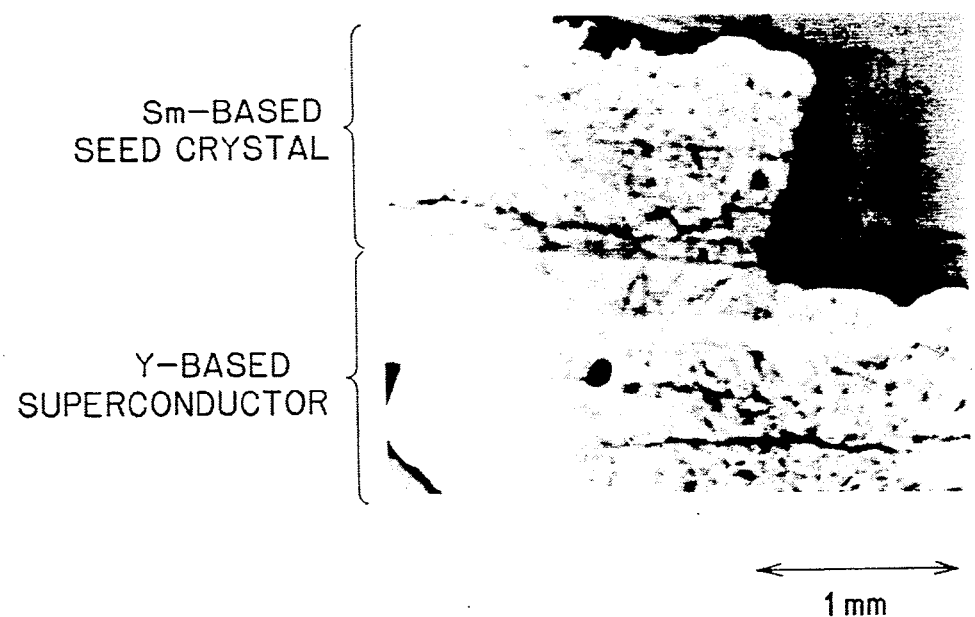
FIG. 2 is a photograph showing the micro structure around an interface between a Y superconductor produced by using a Sm seed crystal and the seed crystal.

These layers were provided on a supporting material with the layer having a Y content of 100 % being located at the lowermost position. Thereafter, the assembly was heated to 1100° C. After one end of the precursor was cooled to 1020° C., a Sm-based single crystal was put as a seed crystal on one end of the precursor in a semi molten state. Then, the assembly was gradually cooled at a rate of 3° C./hr until the temperature of the one end became 910° C. FIG. 2 shows the micro structure of a junction between the seed crystal and the resultant crystal. From the drawing, it is apparent that the crystal orientation of the seed crystal has succeeded.

Figure 3:
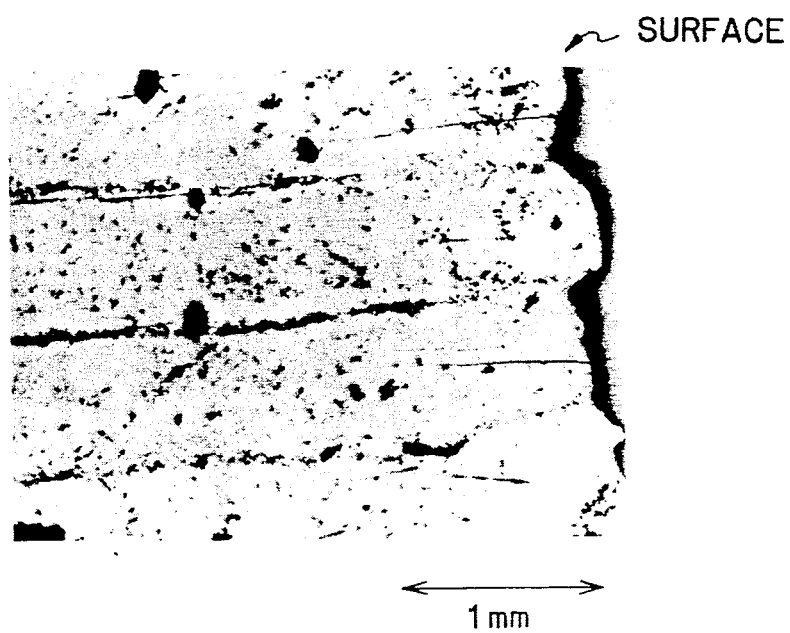
FIG. 3 is a photograph showing the micro structure around the surface of a unidirectionally grown Y superconductor.
Figure 4:
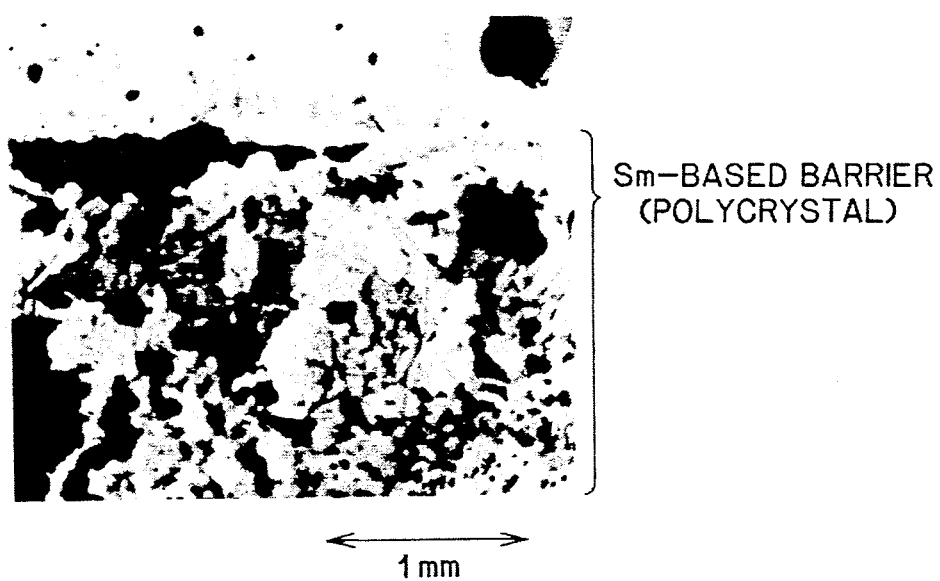
FIG. 4 is a photograph showing the micro structure of a Sm barrier phase wherein a Sm superconductor is used as a barrier to a support.

Thereafter, the following experiment was conducted by using the above mentioned precursor. The precursor was put on a supporting material containing Sm as RE with the Y side being upward. The assembly was heated to 1100° C. Then, a temperature gradient of 5° C./cm was provided within a furnace. After the Y side of the precursor was cooled to 1020° C., a previously prepared Sm-based single crystal was put as a seed crystal on the Y side of the precursor in a semi molten state. Then, the precursor was gradually cooled at a rate of 3° C./hr while maintaining the temperature gradient at 5° C./cm until the temperature of the one end of the precursor became 910° C. FIG. 3 shows the structure of a crystal around the surface of the resultant superconductor. From the drawing, it is apparent that the nucleation is also prevented at the surface of the superconductor. FIG. 4 shows the structure of a Sm barrier inserted between the precursor and the supporting material, that is, a crystal of the precursor contact portion. It is apparent that the Sm-based superconductor is polycrystalline while the Y Yb based superconductor is monocrystalline.

As described above, the superconductor produced by the seed metal inoculation method has a texture such that a 211 phase is finely dispersed in a monocrystalline 123 phase. Further, the above-mentioned 123 phase is has a plurality of domains respectively for individual RE compositions in such a manner that the 123 phase forming temperatures of respective domains continue towards the higher temperature side. The resultant monocrystalline superconductor is a cylindrical material having an approximate size of an average diameter of 50 mm and a height of about 30 mm, that is, has a size 30 to 50 times larger than the prior art material reported in the above-mentioned Physica C.

The 211 phase in the superconductor is dispersed in the 123 phase in a volume fraction in the range of from 5 to 50%, preferably in the range of from 10 to 30%. The grain diameter is as small as 20 μm or less. In particular, when Pt or Rh is added, the average grain diameter is 2 μm or less (maximum value: about 5 μm).

In the superconductor having the above-mentioned structure, although 123 phases different from each other in the RE composition are put on top of one another, since no grain boundary exists between individual domains, no disconnection of the superconductive state occurs, so that a very large current can flow.

Further, the 211 phase can impart toughness to the 123 phase and, at the same time, can hold a guantum magnetic flux passing through the superconductor (pinning action). In the present invention, since the 211 phase is dispersed in a very fine state over the whole texture, it is possible to hold the guantum magnetic flux. Therefore, even when the superconductor is placed in a magnetic field, the guantum magnetic flux is pinned, so that it is possible to obtain a large current density.

The material of the present invention can exhibit excellent superconductive properties by virtue of the above mentioned effect.

EXAMPLES

Example 1

Figure 5:
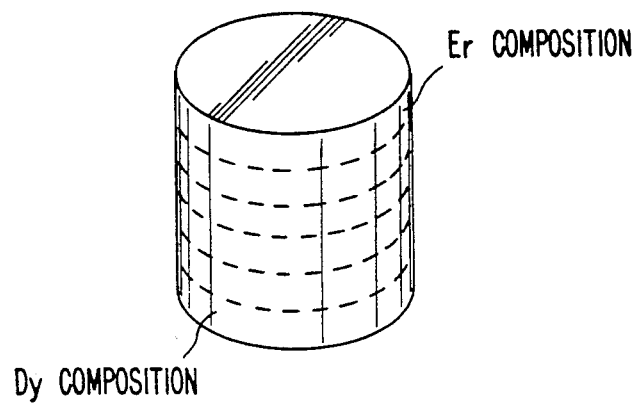
FIG. 5 is a perspective view of a precursor in Example 1.

$Dy_2O_3$ and $Er_2O_3$ were kneaded with each other to prepare 6 kinds of RE compositions with the ratio Dy : Er being varied in 20% increments [(100:0), (80:20), (60:40), (40:60), (20:80) and (0:100)], and $BaCuO_2$ and CuO were mixed with the RE compositions so as to have a ratio RE : Ba : Cu of 25:35:40 to prepare 6 kinds of mixed powders. The mixed powders were successively each put in the form of a layer having a thickness of about 6 mm on top of one another from the Dy layer to the Er layer by using a mold having a diameter of 30 mm to prepare a cylindrical precursor having a height of about 35 mm. FIG. 5 shows the precursor thus prepared.

The precursor was supported by a Pt sheet with the Er side located down, heated in the air from room temperature to 1180° C. over a period of 2 hrs, maintained at that temperature for 30 min, cooled to 1020° C. at a rate of 100° C./hr, and further cooled to 940° C. at a rate of 0.5° C./hr. Thereafter, the precursor was cooled to room temperature within the furnace, reheated to 800° C. in an oxygen gas stream, and gradually cooled to 200° C. at a cooling rate of 8° C./hr.

The resultant sample comprised three large crystal grains, and the largest crystal grain had a volume of about 15 cm³. That is, a very large superconductor material could be prepared.

Example 2

$Dy_2O_3$, $Ho_2O_3$ and $Er_2O_3$ were kneaded with each other to prepare 5 kinds of RE compositions having respective ratios Dy:Ho:Er of (100:0:0), (50: 50:0), (0:100:0), (0:50:50) and (0:0: 100), and $BaCuO_2$ and $BaCu_2O_3$ were mixed with the RE compositions to have a ratio RE:Ba:Cu of (25:28 :47) to prepare 5 kinds of mixed powders. The mixed powders were each successively put in the form of a layer having a thickness of about 6 mm on top of one another from the Dy layer to the Er layer by using a mold having a diameter of 50 mm to prepare a cylindrical precursor having a height of about 30 mm.

The precursor was supported by a Pt sheet with the Er side located down, heated in the air from room temperature to 1180° C. over a period of 2 hr, maintained at that temperature for 30 min, and cooled to 1040° C. at a rate of 100° C./hr. At 1040° C., the cleavage plane of a seed crystal having a RE composition such that the ratio Sm : Nd was 7:3 was put on the precursor in a semi molten state to inoculate the precursor with a seed crystal. The precursor was cooled from 1020° C. to 940° C. at a cooling rate of 0.5° C./hr. Thereafter, the precursor was cooled to room temperature within a furnace, reheated to 800° C. in an oxygen gas stream, and gradually cooled to 200° C. at a cooling rate of 8° C./hr.

Figure 6:
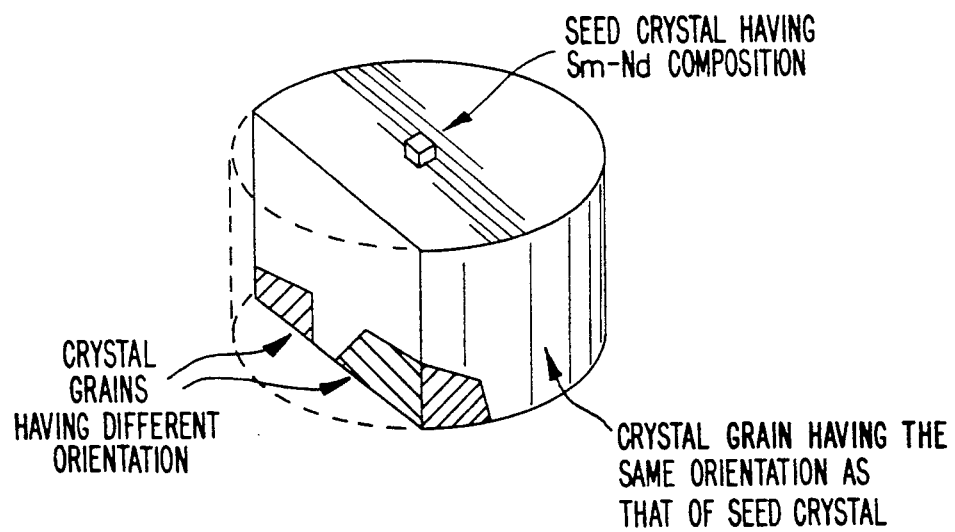
FIG. 6 is a partially cutaway perspective view of a sample prepared according to the process of the present invention in Example 2.

As shown in FIG. 6, the resultant sample was in the form of a cylinder having a diameter of about 43 mm and a height of about 27 mm, and two small crystals having an orientation different from that of the seed crystal were observed, near the platinum, as the supporting material. A major part of the sample, however, comprised a monocrystalline grain having the same orientation as that of the seed crystal, and a superconductor material having a size of 35 cm³ could be obtained.

Example 3

$RE_2BaCuO_5$ having 6 kinds of RE compositions with the ratio Y : Er being varied in 20% increments [(100 :0), (80:20), (60:40), (40:60), (20:80) and (0:100)] was prepared, and $BaCuO_2$ and $BaCu_2O_2$ were mixed with the RE compositions so as to have a ratio RE:Ba:Cu of (18:35:47). Further, 0.5% by weight of a Pt powder was added thereto to prepare 8 kinds of mixed powders. The mixed powders were each successively put in the form of a layer having a thickness of about 5 mm on top of one another from the Y layer to the Er layer by using a mold having a diameter of 50 mm to prepare a cylindrical precursor having a height of about 30 mm.

The precursor was supported by a Pt sheet with the Er side located down, heated in the air from room temperature to 1150° C. over a period of 2 hr, maintained at that temperature for 30 min and cooled to 1030° C. at a rate of 100° C./hr. At 1030° C., the cleavage plane of a seed crystal having such a RE composition that the ratio Sm : Nd was 7:3 was put on the precursor in a semi molten state to inoculate the precursor with the seed crystal. The precursor was cooled from 1010° C. to 940° C. at a cooling rate of 0.5° C./hr. Thereafter, the precursor was cooled to room temperature within a furnace, reheated to 700° C. in an oxygen gas stream, and gradually cooled to 250° C. at a cooling rate of 5° C./hr.

Figure 7:
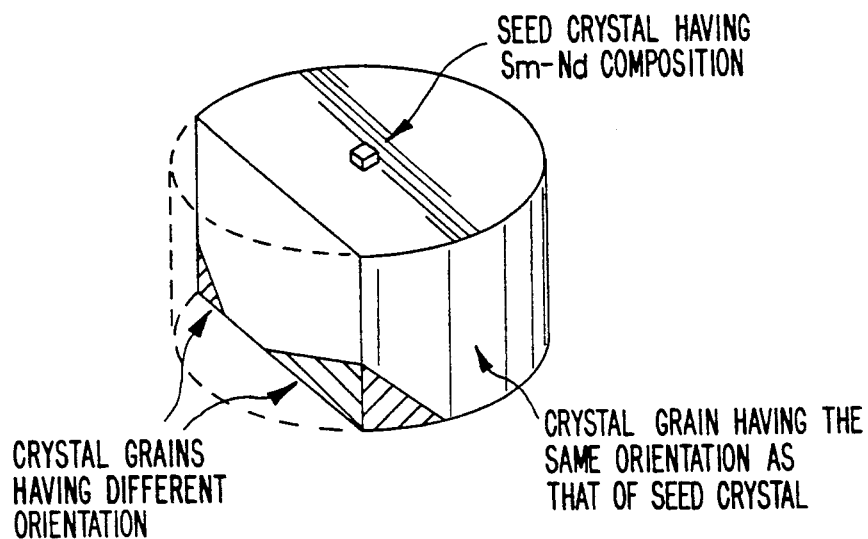
FIG. 7 is a partially cutaway perspective view of a sample prepared according to the process of the present invention in Example 3.

As shown in FIG. 7, the resultant sample was in the form of a cylinder having a diameter of about 46 mm and a height of about 28 mm, and two small crystals having an orientation different from that of the seed crystal were observed, near the platinum, as the supporting material. A major part of the sample, however, comprised a single crystal grain having the same orientation as that of the seed crystal, and a superconductor material having a size of 40 cm³ could be obtained.

The present sample was subjected to a measurement of magnetic susceptibility, Jc, by means of a vibrating sample magnetometer and found to have a Jc value of $1.4 \times 10^4$ A/cm².

Example 4

$RE_2BaCuO_5$ having 6 kinds of RE compositions with the ratio Y:Er being varied in 20% increments [(100 :0), (80:20), (60:40), (40:60), (20:80) and (0:100)] was prepared, and $BaCuO_2$ and $BaCu_2O_2$ were mixed with the RE compositions so as to have a ratio RE:Ba:Cu of (18:30:52). Further, 0.02% by weight of a Rh powder was added thereto to prepare 6 kinds of mixed powders. The mixed powders were each successively put in the form of a layer having a thickness of about 5 mm on top of one another from the Y layer to the Er layer through the use of a mold having a diameter of 50 mm to prepare a cylindrical precursor having a height of about 30 mm.

The above-mentioned precursor with the Er side located down was put on 1.5 mm-thick precursors having respective RE compositions of Sm and Yb prepared by the hammer quenching process to prepare an assembly comprising (precursor having a composition of Y Er)-(precursor having a composition of Yb) (precursor having a composition of Sm) (Pt sheet) disposed in that order. The assembly was heated in the air from room temperature to 1150° C. over a period of 2 hr, maintained at that temperature for 30 min, and cooled to 1030° C. at a cooling rate of 100° C./hr. At 1030° C., the cleavage plane of a seed crystal having such a RE composition that the ratio Sm : Nd was 7:3 was put on the precursor in a semi molten state to inoculate the precursor with the seed crystal. The precursor was cooled from 1010° C. to 940° C. at a cooling rate of 0.5° C./hr. Thereafter, the precursor was cooled to room temperature within a furnace, reheated to 700° C. in an oxygen gas stream, and gradually cooled to 250° C. at a cooling rate of 5° C./hr.

Figure 8:
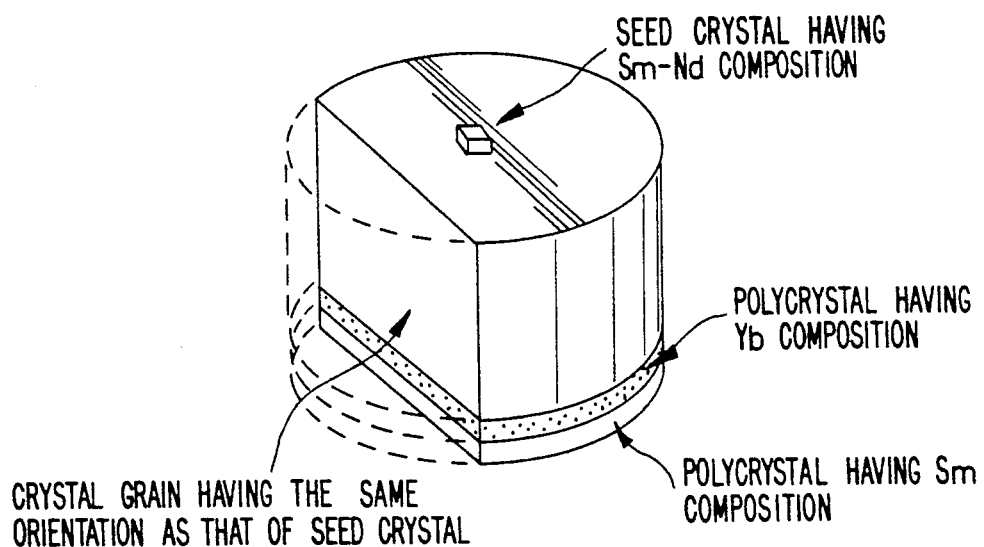
FIG. 8 is a partially cutaway perspective view of a sample prepared according to the process of the present invention in Example 4.

As shown in FIG. 8, the resultant sample was in the form of a cylinder having a diameter of about 46 mm and a height of about 28 mm and comprising a single crystal grain having the same orientation as that of the seed crystal, and a very large superconductor material having a volume of 45 cm³ could be obtained. The present sample was subjected to a measurement of Jc value under the same condition as that of Example 3 and found to have a Jc value of $1.5 \times 10^4$ A/cm².

Example 5

Figure 9:
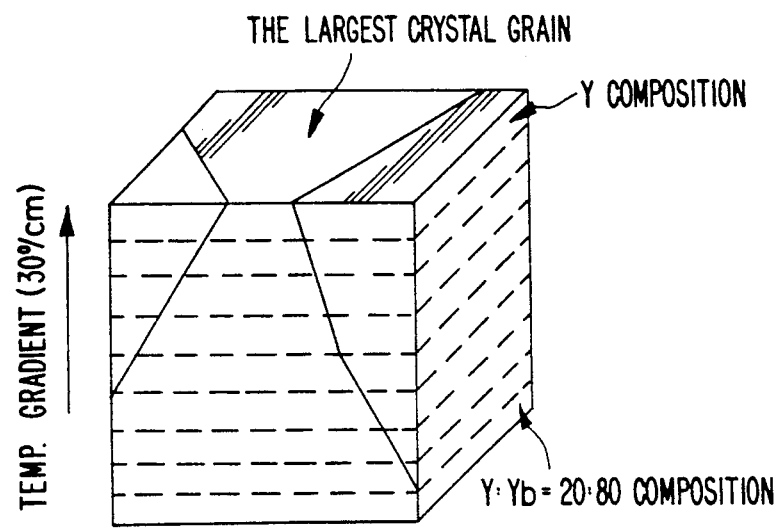
FIG. 9 is a perspective view of a sample prepared according to the process of the present invention in Example 5.

$Y(Yb)Ba_2Cu_3O_{7-x}$ powders and $Y(Yb)_2BaCuO_5$ powders with the proportion of Y to Yb being varied in 10% increments as specified in Table 2 were prepared, and 20% by mole of the $Y(Yb)_2BaCuO_5$ powder was added to the $Y(Yb)Ba_2Cu_3O_{7-x}$ powder so that the ratio RE:Ba: Cu was 6:9:13. The mixtures were heat-melted at 1400° C., and lap hammer quenching was conducted 9 times so that the Y component was successively replaced with Yb to prepare a molding having a thickness of about 2 mm in each layer and a total thickness of about 20 mm. The molding was cut into a size of 20 mm square to prepare a precursor. Due to the difference in the RE component, the 123 phase forming temperatures became as given in Table 2. The precursor was once heated at 1100° C. for 20 min for partial melting, and subjected to unidirectional growth in a temperature gradient of 30° C./cm with the Y composition side facing the higher temperature side by cooling the Y side from 1010° C. to 850° C. through cooling of the whole furnace at a rate of 6° C./hr, thereby preparing a superconductor. In this case, the average crystal growth rate was about 0.8 mm/hr. Oxygen annealing was conducted by gradually cooling the superconductor in an oxygen gas stream from 700° C. to 300° C. at a cooling rate of 10° C./hr. As a result, as shown in FIG. 9, a sample comprising three crystal grains was obtained, and the largest crystal grain had a volume of about 4 cm$^3$.

Example 6

$REBa_2Cu_3O_{7-x}$ powders and $RE_2BaCuO_5$ powders with the RE composition being changed to Sm, Eu, Gd, Dy, Ho, Er, Tm and Yb in that order, and 20% by mole of the $RE_2BaCuO_5$ powder was added to the $REBa_2Cu_3O_{7-x}$ powder so that the ratio RE:Ba:Cu was 6:9:13. The mixtures were heat melted at 1450° C., and lap hammer quenching was conducted 8 times so that the Sm component was successively replaced with Yb to prepare a molding having a thickness of about 2 mm in each layer and a total thickness of about 17 mm. The molding was cut into a size of 20 mm square to prepare a precursor. The precursor was heated to 1150° C., cooled to 1060° C. at a cooling rate of 50° C./hr and further cooled to 910° C. at a cooling rate of 2° C./hr, thereby conducting unidirectional growth. In this case, the average crystal growth rate was about 0.2 mm/hr.

Figure 10:
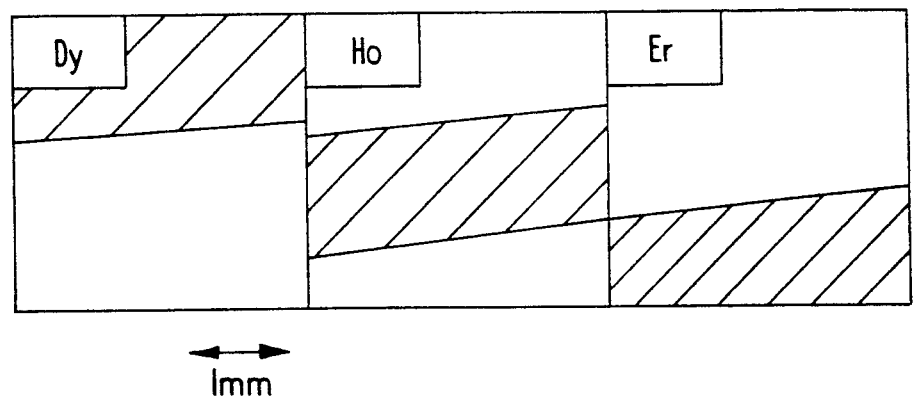
FIG. 10 is a schematic diagram of an EPMA image showing a distribution of each of Ho, Dy and Er elements in a sample prepared according to the present invention in Example 6.

FIG. 10 is a sketch of an EPMA image showing a distribution of Dy, Ho and Er elements. It is apparent that these elements are distributed in a lamellar form. Further, in the resultant sample, the orientation was over the whole sample.

Industrial Applicability

As described above in detail, the present invention facilitates an increase in the size of a bulk material having a high critical current density and can be applied to various fields, which renders the present invention very effective from the viewpoint of industry. Specific examples of the application of the oxide superconductor include a superconductive coil, a superconductive magnetic shielding material and a substrate for a superconductive device.

I claim:

1. A superconductor comprising a composite oxide of at least two RE elements selected from the group consisting of Y, Sm, Eu, Gd, Dy, Ho, Er, Tm, Yb and Lu, and also Ba and Cu, wherein said superconductor comprises a micro structure comprised of a monocrystalline 123 phase of $REBa_2Cu_3O_{7-x}$ and a 211 phase of $RE_2BaCuO_5$ finely dispersed therein, said 123 phase being formed in a plurality of domains respectively for different RE compositions and wherein said domains are arranged on top of one another in a successively increasing or decreasing order of their respective 123 phase forming temperatures.

2. A superconductor according to claim 1, wherein said 211 phase is finely dispersed in a volume fraction in the range of from 5 to 50% in the 123 phase.

3. A superconductor according to claim 1, wherein the grain diameter of siad 211 phase is 20 μm or less.

4. A superconductor according to claim 1, wherein one or both of Pt and Rh are added to said superconductor.

5. A process for the preparation of an oxide high temperature superconductor, which comprises mixing oxides, which may include a composite oxide, of RE, Ba and Cu with each other to produce a mixed powder of a first RE composition so that the molar ratio of metal elements RE, Ba and Cu falls within a region defined by connecting points (10, 60, 30), (10, 20, 70) and (50, 20, 30) to each other on a ternary equilibrium phase diagram, forming a first layer of said first RE composition, forming another layer(s) containing a second RE composition within said region, having a different 123 phase forming temperature than said first RE composition contained in said first layer, putting the resultant plurality of layers on top of one another in a successively increasing or decreasing order of their respective 123 phase forming temperatures, subjecting the resultant assembly to press molding to form a first precursor, putting said precursor on a supporting material with the layer having the highest 123 phase forming temperature being farthest from said supporting material, heating said precursor to a temperature range in a solid-liquid coexisting region to bring said precursor into a semi-molten state, and gradually cooling said precursor in a 123 phase temperature range to grow a 123 phase crystal at a growth rate of 5 mm/hr or less.

6. A process according to claim 5, which further comprises, after hating said precursor to a temperature range in a solid-liquid coexisting region to bring said precursor into a semi-molten state, cooling said precursor from said temperature range to a second temperature range for seed crystal inoculation, inoculating said precursor in said second temperature range with a seed crystal comprising a RE composition having a 123 phase forming temperature above the highest 123 phase forming temperature in said precursor and gradually cooling said inoculated precursor in a 123 phase forming temperature range to continuously grow a 123 phase.

7. A process for the preparation of an oxide high temperature superconductor, which comprises mixing oxides, which may include a composite oxide, of RE, Ba and Cu with each other to produce a mixed powder of a first RE composition so that the molar ratio of metal elements RE, Ba and Cu falls within a region defined by connecting points (10, 60, 30), (10, 20, 70) and (50, 20, 30) to each other on a ternary equilibrium phase diagram, forming a first layer of said first RE composition, heating said first layer to 1200° C. or above to form a melt, rapidly cooling said melt to form a first molding, forming another molding(s) through the same procedure from a mixed powder layer containing a second RE composition within said region, having a different 123 phase forming temperature than said first RE composition contained in said first layer, putting the resultant plurality of moldings on top of one another in a successively increasing or decreasing order of their respective 123 phase forming temperatures, to form a first precursor, putting said precursor on a supporting material with the layer having the highest 123 phase forming temperature being farthest from said supporting material, heating said precursor to a temperature range in a solid-liquid coexisting region to bring said precursor into a semi-molten state, and gradually cooling said precursor in a 123 phase temperature range to grow a 123 phase crystal at a growth rate of 5 mm/hr or less.

8. A process according to claim 5, wherein, between said first precursor and said supporting material, a second precursor comprising a RE composition having a crystal forming temperature above that of the RE composition of the 123 phase in the first precursor and a third precursor comprising a RE composition having a crystal forming temperature below that of the RE composition of the 123 phase in the first precursor are provided to form an assembly comprising first precursor—third precursor—second precursor—supporting material in that order, and the resultant assembly is heated to a temperature in the range of from 900° to 1300° C.

9. A process according to claim 7, wherein, between said first precursor and said supporting material, a second precursor comprising a RE composition having a crystal forming temperature above that of the RE composition of the 123 phase in the first precursor and a third precursor comprising a RE composition having a crystal forming temperature below that of the RE composition of the 123 phase in the first precursor are provided to form an assembly comprising first precursor—third precursor—second precursor—supporting material in that order, and the resultant assembly is heated to a temperature in the range of from 950° to 1350° C.

10. A process according to claim 5 or 6, wherein the temperature in the solid-liquid coexisting region is 900° to 1300° C.

11. A process according to claim 5 or 6, wherein the 123 phase forming temperature is in the range of from 1070° to 840° C. and in the range of from $(Tg(H)+10)°$ C. to $(Tg(L)-40)°$ C. wherein $Tg(H)$ represents the highest 123 phase forming temperature and $Tg(L)$ represents the lowest 123 phase forming temperature.

12. A process according to claim 6, wherein the seed crystal inoculation temperature is in the range of from 900° to 1100° C.

13. A process according to claim 5 or 6, wherein the gradual cooling in the 123 phase forming temperature range is conducted at a cooling rate, R, defined by the following formula:

$$R \leq k \cdot \Delta Tg/D \; (°C./hr)$$

wherein K represents a target grain growth rate (mm/hr);

$\Delta Tg$ represents the maximum Tg deviation, provided that $\Delta Tg = (Tg(H)+10)° C. - (Tg(L)-40)° C.$; and D represents the total thickness (mm).

14. A process according to claim 5 or 6, wherein the cooling in the 123 phase forming temperature range is conducted by stepwise cooling.

15. A process according to claim 13, wherein stepwise cooling is conducted at said cooling rate, R (° C./hr).

16. A process according to claim 5, wherein one or both of Pt and Rh is added in an amount of 1 to 20% by weight to said precursor.

* * * * *